(12) United States Patent
Michiels et al.

(10) Patent No.: US 6,736,058 B2
(45) Date of Patent: *May 18, 2004

(54) UPHILL SCREEN PRINTING IN THE MANUFACTURING OF MICROELECTRONIC COMPONENTS

(75) Inventors: John M. Michiels, Boise, ID (US); Darryl M. Stansbury, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/152,257

(22) Filed: May 21, 2002

(65) Prior Publication Data

US 2002/0134259 A1 Sep. 26, 2002

Related U.S. Application Data

(63) Continuation of application No. 09/650,840, filed on Aug. 30, 2000, now Pat. No. 6,439,115.

(51) Int. Cl.[7] .................................................. B41M 1/12
(52) U.S. Cl. ...................................... 101/129; 101/123
(58) Field of Search ............................... 101/114, 123, 101/124, 126, 127, 128.21, 128.4, 129; 118/406; 361/748, 761, 762; 430/308; 438/20, 125

(56) References Cited

U.S. PATENT DOCUMENTS

| 5,046,415 A | 9/1991 | Oates |
|---|---|---|
| 5,359,928 A | 11/1994 | Blessington et al. |
| 5,394,796 A | 3/1995 | Jones et al. |
| 5,484,314 A | 1/1996 | Farnworth |
| 5,492,234 A | 2/1996 | Fox, III |
| 5,537,738 A | 7/1996 | Cathey et al. |
| 5,588,359 A | 12/1996 | Hofmann et al. |
| 5,612,256 A | 3/1997 | Stansbury |
| 5,653,017 A | 8/1997 | Cathey et al. |
| 5,760,470 A | 6/1998 | Stansbury |
| 5,766,053 A | 6/1998 | Cathey et al. |
| 5,847,445 A | 12/1998 | Wark et al. |
| 6,170,394 B1 | 1/2001 | Kinoshita |
| 6,253,676 B1 | 7/2001 | Murakami |
| 6,267,818 B1 | 7/2001 | Volpe |

*Primary Examiner*—Ren Yan
(74) *Attorney, Agent, or Firm*—TraskBritt

(57) ABSTRACT

Method for screen printing a continuous structure on a substrate wherein the screen printed structure extends from at least a first level to at least a second level. The disclosed method is particularly suitable for the fabrication of microelectronic devices and components thereof including the fabrication of field emission display devices. Preferably, a print screen of a preferred thickness having a preconfigured print pattern formed therethrough, in combination with a squeegee having a hardness within a preferred range, are used to force a screen printable substance onto a substrate while maintaining a portion of the print screen within a preferred reference angle. The resulting screen printed structure extends from at least one lower level to at least one upper level in a continuous "uphill" manner. The disclosed method is particularly suitable for forming continuous electrically conductive structures or circuit traces extending from a lower level of a substrate, such as an anode plate of an FED device, up onto at least one second surface vertically distanced from the substrate. The electrically conductive structure may optionally terminate into a specifically configured contact pad for accommodating complementary contacting structures located on a mating component, such as a cathode plate of an FED device.

24 Claims, 8 Drawing Sheets

UPHILL SCREEN PRINTING IN THE MANUFACTURING OF MICROELECTRONIC COMPONENTS

CROSS-REFERENCE TO RELATED APPLICATION

This application is a continuation of application Ser. No. 09/650,840, filed Aug. 30, 2000, now U.S. Pat. No. 6,439,115, issued Aug. 27, 2002.

BACKGROUND OF THE INVENTION

1. Field of the Invention

This invention relates to microelectronic devices and the manufacturing thereof, including, but not limited to, the manufacturing of field emission, or effect, display (FED) devices. More particularly, this invention relates to the screen printing of screen printable substances onto various substrates to form, for example, electrically conductive traces, or conductor elements, on selected components of microelectronic devices such as, but not limited to, substrates incorporated within FED devices.

2. State of the Art

Screen printing is frequently used within the microelectronic industry in the manufacturing of a wide variety of microelectronic components and products. For example, various electrical circuits, or traces, can be formed on a selected planar, rigid substrate by screen printing to provide a wide selection of electrical circuitry and circuit functions. Such screen printed electrical circuits can include, for example, conductive elements and paths, resistive elements and paths, as well as various elements that have certain preselected insulative or dielectric characteristics or qualities. Thus, the term "conductive" as used herein broadly refers to any material capable of conducting electricity.

In the fabricating of field emission displays, or flat-panel displays, the microelectronic industry faces a constant demand by the market to make such displays thinner and lighter and generally more compact compared to the previous generation of displays. Furthermore, there is considerable market pressure for manufacturers to generally make microelectronic devices, including field emission displays, for example, more quickly and less expensively in order for companies selling products incorporating such microelectronic devices to be, and remain, competitive in the marketplace.

U.S. Pat. Nos. 5,766,053 and 5,537,738 each issued to Cathey et al., assigned to the present assignee, and which are incorporated by reference herein, disclose an exemplary internal flat-panel field emission display and exemplary methods of attaching and electrically connecting inwardly facing planar substrates having matching patterns of bond pads, respectively. In both of these patents, selected elevated bond pads located on top of an insulative spacer, or ridge, which is provided along a selected edge of the lower-most substrate, are electrically connected by wire bonds to respectively associated circuit traces which were previously disposed upon the lower-most substrate so as to terminate short of the insulative spacer and be adjacent and located below the respectively connected elevated bond pads. In both patents, the respective electrical traces and the insulative spacer, or ridge, were formed by the screen printing of conductive and dielectric screen printable materials.

Exemplary prior known screen printing processes used in the formation of microelectronic components include the printing of conductive layers upon a selected substrate by forcing a paste, or printable substance, of a preselected viscosity through a stainless steel or, more often, a monofilament polymer screen of a preselected mesh having a preselected negative pattern formed through the screen by various known methods. The screen having a preselected pattern preformed therethrough is stretched so as to be tautly secured to a support frame such that the screen and the substrate can eventually be brought into very close proximity, preferably just short of actual direct contact with each other. Upon the screen being precisely positioned above the substrate in which the screen printable substance is to be disposed, the screen printable substance is typically introduced on top of the screen and a squeegee, or rubber blade, is biased toward the substrate and is swept across the flexible screen thereby pushing the printable substance forward along the screen as well as forcing a portion of the screen printable substance downward through the negative pattern provided on the screen and onto the underlying substrate. After the printable substance has been disposed on the receiving surface of the substrate and the screen and squeegee have been lifted away therefrom, the screen printed substance, or paste, is typically dried by firing at a selected temperature and duration. Thereafter, the substrate can be readied for further screen printing. For example, a dielectric layer may subsequently be screen printed on top of an underlying, previously screen printed conductive layer, or upon the last screen printed substance being fired, and the screen printed substrate may be forwarded on for further post-screen printing processing.

With respect to the fabrication and operation of field emission displays in particular, typically, a cathode plate having a plurality of individual cathodic electrodes is positioned in a parallel, spaced apart relationship with a transparent display substrate covered by a phosphorous film acting as an anode plate. Borosilicate glass is often selected as a transparent substrate due to it having a compatible coefficient of thermal expansion and suitable structural characteristics. The two plates are spaced away from each other by at least one dielectric spacer, ridge, or rail, which borders at least a portion, if not the entire periphery, of what is to be the display area or window. Upon providing electrical potentials of appropriate polarization and magnitude to various electrodes located on the cathode plate, electrons are emitted therefrom and are drawn toward the opposing, but spaced-apart, glass substrate serving as an anode plate whereon images can be viewed through the display window. In order for the opposing cathode plate and the transparent glass substrate/anode plate to function properly, the very small space between the two plates must be uniform and the various thickness of each of the various layers of screen printed material provided on each plate must be controlled within strict dimensional tolerances. Such strict dimensional tolerances are needed, not only for keeping the final FED unit as thin as possible, but are also needed for quality control purposes of the image to be displayed. For example, various qualities of the displayed image, such as overall image uniformity, resolution, and brightness, can be directly influenced by minute, or out of specification, spacing of the two opposing plates.

U.S. Pat. No. 5,612,256 issued to Stansbury, incorporated by reference herein, is directed toward multi-layer electrical interconnection structures and fabrication methods. More particularly, the '256 Stansbury patent discloses a flat-panel field emission display wherein a dielectric connector ridge having a generally planar top surface with generally curved side surfaces, is screen printed onto the rear surface of a faceplate of an FED device. The faceplate is also provided with a plurality of lower-level electrically conductive connectors by way of conventional screen printing that extend generally perpendicular to, and are spaced along one side but terminate short of, the dielectric connector ridge. Preferably, a plurality of discrete upper-level connectors ultimately positioned in registry with the lower-level connectors are screen printed atop the dielectric connector ridge in a subsequent screen printing process. In due course, each of the upper-level connectors, and the corresponding discrete lower-level connectors, are, respectively, electrically interconnected by a bond wire, for example, in accordance with a preferred embodiment disclosed therein.

Such a representative wire bonded connection in the context of a representative portion of an anode plate 16 of a field emission display is shown in drawing FIGS. 1A through 1C of the present drawings. More particularly in drawing FIG. 1A hereof, anode plate 16 has a transparent glass substrate 2 serving as an anode baseplate. Mounted upon substrate 2 is a first layer of a dielectric material 4. Mounted on top of dielectric layer 4 is an optional second dielectric layer 6 that is usually precision trimmed or polished to provide an upper planar surface that is of a specific height above the substrate, typically on the order of 10 mils (0.010 inches/0.254 mm) in height. Thus, dielectric layers 4 and 6 taken together, form a dielectric or insulative ridge 3, also referred to as an insulative spacer or rail. Lower level conductive element or trace 8 is located on substrate 2. Lastly, a bond wire 12 is bonded at bond points 14 to provide an electrically conductive path between lower-level conductive trace 8 and upper-level conductive trace 10.

Illustrated in drawing FIGS. 1B and 1C hereof is the screen printing process of forming conductive traces 8 and 10 on a portion of a representative substrate, which in the case of an FED serves as an anode plate 16 shown in drawing FIG. 1A. In drawing FIG. 1B, the ridge or spacer 3, comprising vertically stacked dielectric layers 4 and 6, has previously been formed onto substrate 2 by screen printing processes known within the art. A screen printing apparatus 18, including a screen support frame 20 and a flexible screen 22, is biased toward substrate 2 by a squeegee 24. The arrow depicts the direction in which squeegee 24 is moved across the top of screen 22, usually at a constant speed, thereby forcing conductive paste 26 downward through a pattern in screen 22 and onto the exposed surface of substrate 2, thus forming lower-level conductive trace 8. Illustrated in drawing FIG. 1C is the forming of upper-level conductive trace 10 by squeegee 24 biasing screen 22 downward to nearly press against the top of layer 6 while simultaneously moving forward, thereby causing conductive paste 26 to be laid down on the exposed surface of layer 6 through a preformed pattern in screen 22. Note that conductive trace 8 stops short of the proximate edges of dielectric layers 4 and 6 which form elevated ridge or rail 3 so that screen 22 does not unduly contact ridge 3 while forming lower-level conductive trace 8.

Although the '256 Stansbury patent depicts in drawing FIG. 6 thereof, and discusses in column 5 of the specification thereof, that a continuous terminal conductor having a lower-level base portion positioned directly on the rear surface of the faceplate, and an upper-level connecting portion positioned atop the dielectric connector ridge, can be screen printed in a continuous manner onto both surfaces, the specification in column 8 states that, in practice, it is impractical to screen print such continuous terminal conductors over the abrupt elevational change presented by the connector ridge. It is also noteworthy that the connector ridge depicted in drawing FIG. 6 of the '256 patent has a rounded or curved side profile and, clearly, does not include a substantially abrupt vertical, or substantially straight, side profile extending perpendicular to substrate 2.

Thus, there remains a need within the art for effective, practical screen printing processes and apparatus that can be used by the art to screen print screen printable substances, such as electrically conductive pastes, to form small, dimensionally close-toleranced continuous multi-level conductive traces, or conductive elements, especially suitable for use in the manufacturing of microelectronic devices, such as field emission display devices manufactured on high-speed production lines.

There further remains a need within the art for effective, practical screen printing processes and apparatus that can be used to form multi-level conductive traces, or conductive elements, suitable for use in the fabrication of microelectronic devices which require less time and fewer fabricating steps, thereby lowering the costs associated with manufacturing microelectronic devices such as field emission displays.

A still further need within the art includes the need for microelectronic devices and products which incorporate components having screen printable substances disposed thereon by screen printing processes and apparatus that offer enhanced versatility and capability compared to prior known screen printing processes and apparatus.

BRIEF SUMMARY OF THE INVENTION

The present invention provides the ability to form, to close dimensional tolerances and geometries, electrically conductive traces or other structures that extend from one level to at least one other elevated level by the screen printing of screen printable substances, such as, but not limited to, conductive pastes of preselected viscosities. Preferably, the subject invention includes the screen printing of a screen printable material upon a generally planar substrate to form a conductive trace thereon. The screen printing continues in an "uphill" manner to extend the conductive trace upward onto at least one elevated surface located above the underlying substrate. The present invention is particularly suited for, but not limited to, the formation of multi-level conductive traces used in providing an electrically conductive path from a first level to at least one second elevated level in microelectronic devices.

The present invention is particularly useful in the fabrication of flat-panel field emission displays (FED) in which a first transparent substrate made of borosilicate glass is provided with an insulative structure or spacer, also referred to as a ridge, rail, or similar structure, made of a preselected dielectric material. The insulative spacer can extend upwards of 10 mils (0.010 inches/0.025 cm) from the underlying glass substrate. In the preferred embodiment, a continuous conductive trace having a preselected geometry, such as a generally rectangular shape, is applied to the substrate by way of a squeegee being biased against and traversing a screen having preformed patterns, or openings, therein. Preferably, the screen is very thin in cross-sectional thickness, of the magnitude of 0.2 mils (0.0002 inches/ 0.0005 cm) for example, and when finally positioned, is preferably positioned to have a preferred snap-off distance, of the magnitude of 0.1 to 0.125 mils (0.0001 inches/0.0003 cm to 0.000125 inches/0.00037 cm) for example, being maintained between the bottom of the screen and the top of the substrate or other surface in which the screen printable material is to be disposed upon. A very soft squeegee, that is, a wiper or blade having a comparatively low durometer value, is used in combination with the thin screen to sweep the screen printable substance of a preselected viscosity through the screen and onto the substrate and up onto the top of the spacer in preferably a continuous uninterrupted fashion to preferably form a discrete, continuous bi-level or multi-level conductive trace, or another similarly formed structure.

Preferably, the angle of the screen with respect to the top surface of the spacer is maintained at a preselected angle to optimize the disposing of the screen printable material onto the substrate and up onto the various elevated surfaces or levels that the screen printable material is to be disposed.

Furthermore, the screen used in disposing screen printable material in accordance with the present invention is preferably provided with openings, or patterns, that are geometrically configured to compensate for the "uphill" portion or region of the structure to be formed. For example, if a conductive trace is to have a generally constant width along its longitudinal axis, including that portion of the trace which rises from a first level to a second higher or elevated level, it may be necessary to reduce the width of the corresponding opening in the screen to compensate for distortions that may occur in the transition from one level to the next level of the conductive trace to be formed. To illustrate, it may be necessary to reduce the width of the opening in the screen corresponding to the "uphill" portion of the conductive trace to compensate for the screen printable material's propensity to undesirably disperse laterally beyond the desired width that the "uphill" portion of the conductive trace is to have. In other words, the screen printable material or paste may flow outwardly or bulge on one or both sides of the "uphill" region and thereby possibly come into contact with proximately located conductive traces if the corresponding portion of the opening in the screen is not reduced in width to compensate for the tendency to bulge or spread. This unwanted lateral distortion could be particularly troublesome when using materials or pastes of high viscosity to form traces or other structures that are to be very closely positioned with respect to each other. Such a case could occur when forming thick film conductive traces that are to have a center-to-center spacing or pitch, ranging in the magnitude of a few mils to 10 mils (0.010 inches/0.254 mm) or more.

The uphill screen printing of the present invention is particularly suitable for simultaneous formation of conductive traces on several areas of a common substrate in a high-quantity, high-speed production environment in which the substrate will eventually be segmented into a multitude of individual microelectronic device sub-components. For example, a preselected number of individual areas preferably arranged in an array of a selected pattern on a substrate, such as by a preselected number of rows and columns, can have a number of screen printing operations performed thereon, including the screen printing of conductive traces or other structures, in accordance with the present invention. Upon the completion of the last operation that is to be performed on each of the individual areas or array of areas located on the common substrate, the individual areas of the array are then segmented into individual substrates which will eventually serve as an individual component in a FED device, for example.

DETAILED DESCRIPTION OF THE INVENTION

Referring now to drawing FIGS. 2A through 2D of the drawings, a substrate 2, such as a transparent plate formed of borosilicate glass, a ceramic substrate, or other substrate formed of a suitable material, is positioned within a screen printing apparatus 18. Insulative or dielectric layers 4 and 6 are previously disposed onto substrate 2 at a preselected location by a preselected method, such as by screen printing.

Figure 2A:
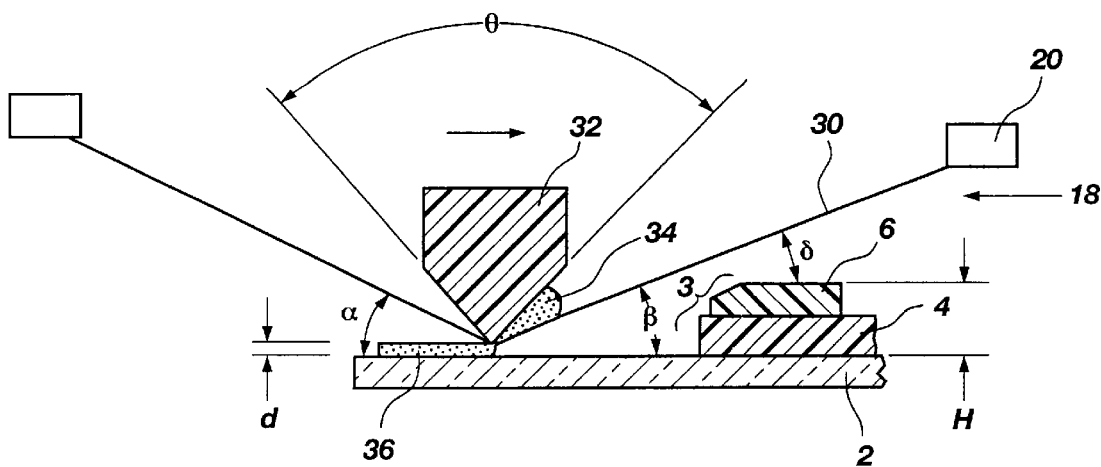
FIGS. 2A–2D are cross-sectional views illustrating the screen printing of an exemplary conductive trace on a portion of a representative microelectronic component in accordance with the present invention.

In the case of constructing an anode plate for an exemplary field emission display device, for example, an insulative or dielectric, rail, spacer, ridge, or similar spacer structure 3, preferably comprised of stacked layers 4 and 6, are positioned along at least one portion of what is to be the display window of such a FED device. Typically, upper-most dielectric layer 6 will be micro-polished so that the upper-most surface, as oriented in drawing FIGS. 2A through 2D, will be reduced to a preselected height H above the upward facing surface of substrate 2. Height H for an elevated structure or spacer 3, such as provided on an anode plate to be used in a FED device, will typically range from 3 to 5 mils (0.003 inches/0.008 cm–0.005 inches/0.013 cm). However H, as depicted in FIG. 2A, can range upwards of at least approximately 10 mils (0.010 inches/0.025 cm) with screen printing structures in accordance with the present invention. Furthermore, although spacer 3 has been illustrated as being comprised of two dielectric layers, alternatively, a single layer or more than two layers could be used to form a raised or elevated structure such as spacer 3. Furthermore, spacer 3 need not have insulative, dielectric qualities. Screen support frame 20 can be obtained from a number of commercial sources and is provided with a screen 30 which ranges in overall width of about 20 inches (50 cm) and, for best results, will have a very thin cross-sectional thickness ranging from approximately 0.0002 inches to approximately 0.0007 inches (approximately 0.005 to approximately 0.0018 cm).

Preferably, screen 30 is formed of an interwoven mesh material such as fine diameter stainless steel wire or a monofilament polyester which has been woven to have a fine mesh value ranging from approximately 80 to approximately 500 mesh. Typically, the fine steel wire or polyester filament will have a nominal diameter ranging from approximately 0.2 mils to approximately 0.8 mils (0.0002 inches/0.0005 cm to 0.0008 inches/0.0020 cm) with an approximate mesh range of 80–500. Screens of suitable material and mesh are commercially available from a number of manufacturers, including Rigsby Screen and Stencil, Inc., Torrance, Calif.; Utz Engineering, San Marcos, Calif.; and Micro-Screen, South Bend, Ind.

As referred to within the art, "snap-off" distance d is the distance in which the bottom surface of screen 30 is ideally brought within proximity of the back surface of substrate 2 which is to be screen printed with a screen printable paste or substance, such as conductive paste 34. In the case of screen printing a conductive trace, such as lower level portion 36 of a conductive trace shown partially disposed on substrate 2 in drawing FIG. 2A, a snap-off distance d, ranging from about 0.1 mils (0.00025 inches/0.00064 cm) to 0.125 mils (0.000125 inches/0.000317 cm), has been demonstrated to work very well. However, depending on rheological characteristics of the screen printable substance or paste to be applied to substrate 2, a greater snap-off distance ranging upwards of 0.125 mils (0.000125 inches/0.000317 cm) can also be used depending upon the overall dimensions, geometry, and spacing of the structures to be screen printed. In some applications, the screen may actually contact the substrate and other structures to be screen printed, and such contact may not necessarily negatively affect the quality of the final screen printed structure.

Preferably, for screen printing conductive traces onto a glass substrate and up onto an insulative spacer having a height H ranging upwards of 10 mils (0.010 inches/0.025 cm), a screen printable electrically conductive paste material having a viscosity ranging between 50,000 and 600,000 centipoise is suitable. A viscosity in the range of 250,000 to 400,000 centipoise is preferred when screen printing closed-spaced structures onto two or more levels, such as when screen printing conductive traces onto a spacer having a top-most surface with a height between approximately 3 to 5 mils (0.003 inches/0.008 cm to 0.005 inches/0.013 cm) from the substrate in which it is disposed upon.

As depicted in drawing FIG. 2A, there are three different angles identified with respect to screen 30 and the substrate being printed. Angle $\alpha$, is the angle formed between the bottom of screen 30 behind squeegee 32 and the upwardly facing surface of substrate 2. Angle $\beta$ is the angle formed between the bottom of screen 30 ahead of squeegee 32 and the upwardly facing surface of substrate 2. Angle $\delta$ is the angle formed between the bottom of screen 30 ahead of squeegee 32 and the top-most surface of spacer 3, which in drawing FIG. 2A would be the top-most exposed surface of layer 6.

Figure 2B:
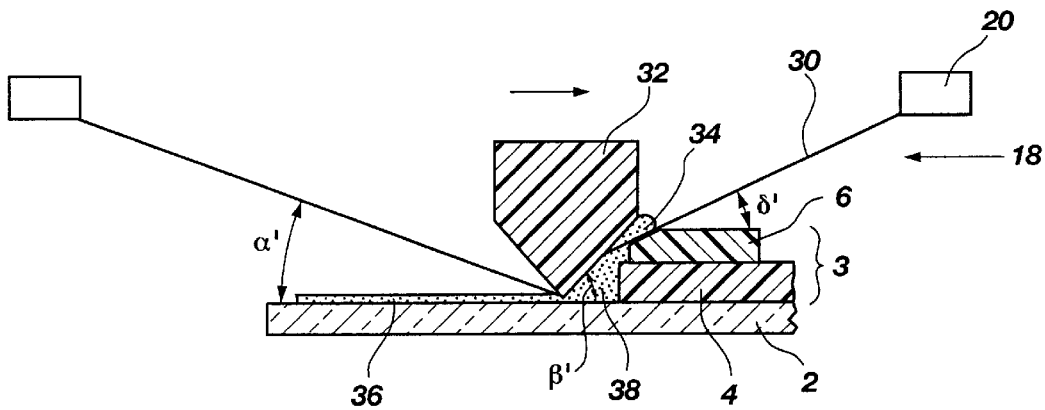

As shown in drawing FIG. 2B, squeegee 32 is continuously biased downward and is preferably drawn in the direction of the arrow across the screen at a constant speed ranging between 0.25 inches per second and 3.00 inches per second, with a speed of approximately 0.75 inches per second being particularly suitable. Furthermore, squeegee, wiper, or blade 32 preferably has a generally triangular-shaped cross-sectional area terminating into a point, and preferably has an angle $\Theta$ (as depicted in FIG. 2A) in the range of 30° to 120°, with an angle $\Theta$ of approximately 45° being particularly suitable for forming a wide variety of differently shaped conductive traces up onto structures of various heights, such as spacer structures, frequently called for when constructing precisely dimensioned and configured electrical circuits on substrate components used in FED devices when screen printing a conductive trace onto at least one lower surface and at least one higher or elevated surface having a height ranging between 3 to 5 mils (0.003 inches/0.076 mm to 0.005 inches/0.127 mm), if not upwards of 10 mils (0.010 inches/0.254 mm) from the lower surface.

As squeegee 32 traverses substrate 2, the various angles $\alpha$, $\beta$, and $\delta$ will change slightly due to frame 20 being fixed in relation to substrate 2. Thus, each angle $\alpha$, $\beta$, and $\delta$ is respectively designated with a single prime (') and a double prime (") in FIGS. 2B and 2C to show such slight variations of angle as the screen printing progresses in a preferably continuous manner.

Generally, angle $\delta$, including any slight variations from the nominal value thereof, i.e., the angle formed between the bottom surface of screen 30 and the top surface of layer 6 of spacer 3, which preferably will be a planar surface as shown in FIGS. 2A through 2D, preferably should be maintained within a value of approximately 5 to 10 degrees to provide the best results when practicing the present invention. However, it should be understood that it may be necessary or preferred to maintain an angle which is less than, or, alternatively, more than, the preferred range in order to accommodate specific structures or geometries while screen printing various structures having at least one or more levels.

Illustrated in drawing FIG. 2B, in particular, is the "uphill" portion 38 of the conductive trace being formed as squeegee 32 approaches the left-hand portion of spacer 3. Preferably, angle $\delta$, and any slight variations thereof, is maintained within the preferred range of approximately 5 to 10 degrees to provide the best results, particularly when applying uphill portion 38 of the exemplary conductive trace. By carefully maintaining screen print angle $\delta$ within the preferred range, the unwanted tendency for conductive paste 34 to be laterally dispersed will be minimized, if not prevented. Furthermore, it is suggested that relatively soft squeegee 32 be biased toward substrate 2 with significantly more pressure than when using conventional screen printing techniques to further minimize the potential for unwanted dispersion of conductive paste 34, especially when disposing uphill portion 38. It is further suggested that screen 30 be stretched very tightly within frame 20 of screen printing apparatus 18, and to a certain extent, also by way of the downward bias of squeegee 32, so as to form a tight sealing "gasket" around the particular area or pattern in which screen printable conductive paste 34 is being disposed onto substrate 2 and upwardly onto the upper-most surface of spacer 3.

Figure 1A:
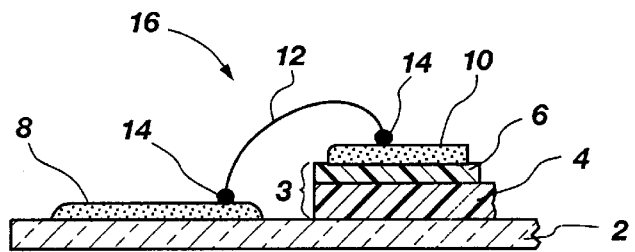
FIG. 1A is a cross-sectional view of a portion of an exemplary microelectronic component provided with conductive traces formed by successive screen printing operations and then joined via a wire bond in accordance with the prior art.
Figure 1B:
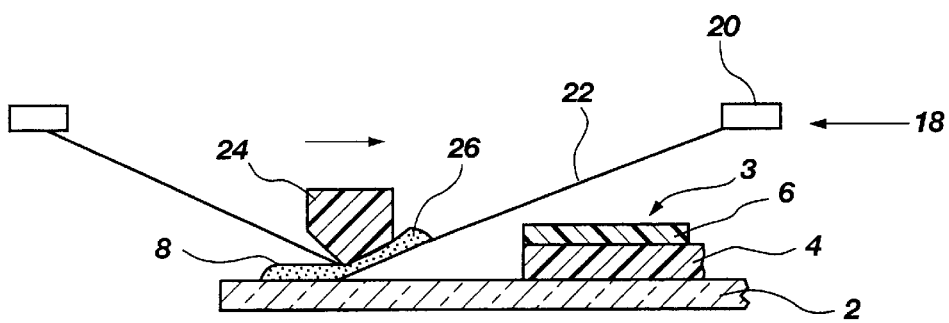
FIGS. 1B–1C are cross-sectional views illustrating a representative, prior known screen printing method for forming conductive traces on a portion of the representative microelectronic component of FIG. 1A.
Figure 1C:
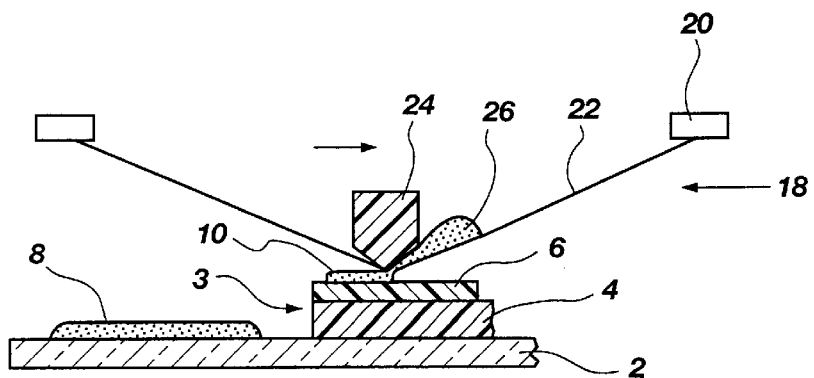
Figure 2C:
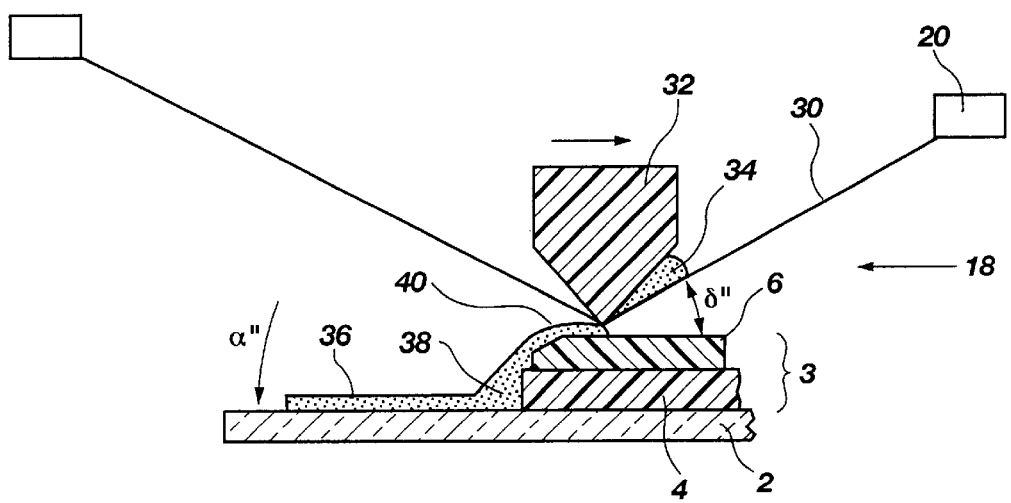

Illustrated in drawing FIG. 2C is the continuing application of screen printable paste 34 on the upper-most surface of layer 6 of spacer 3 to form a second or upper-level portion 40 of the exemplary conductive trace. That is, the first or lower-level portion 36 has already been disposed on substrate 2, as has uphill portion 38, and against the side of layers 4 and 6. As can be seen in the cross-sectional view of drawing FIG. 2C, the exemplary conductive trace is continuous and uninterrupted and has been formed in a single, continuous sweep of squeegee 32 across patterned screen 30. Forming a conductive trace which extends from a first level to a second level in such a single-step offers a significant savings with respect to production time and associated fabrication costs, especially when compared to the prior art method of wire bonding as illustrated in drawing FIGS. 1A through 1C of the drawings.

Figure 2D:
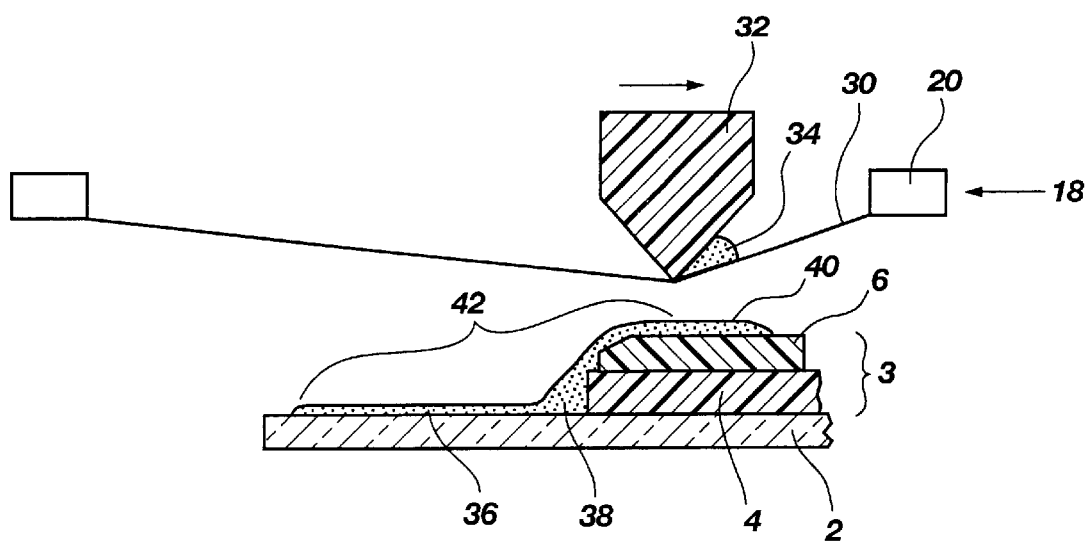

Illustrated in drawing FIG. 2D is the fully formed conductive trace 42 with squeegee 32 and screen 30 being vertically withdrawn from substrate 2 and spacer 3 on which conductive trace 42 now resides in wet form. At this point, substrate 2 would likely be removed from screen printing apparatus 18 and placed in an oven wherein conductive trace 42 would be "fired" or, in other words, dried. After exposing substrate 2 to elevated temperatures in order to fire conductive trace 42, substrate 2 could be prepared for further processing, including additional screen printing or being assembled with other components, to ultimately form a FED device.

Figure 3B:
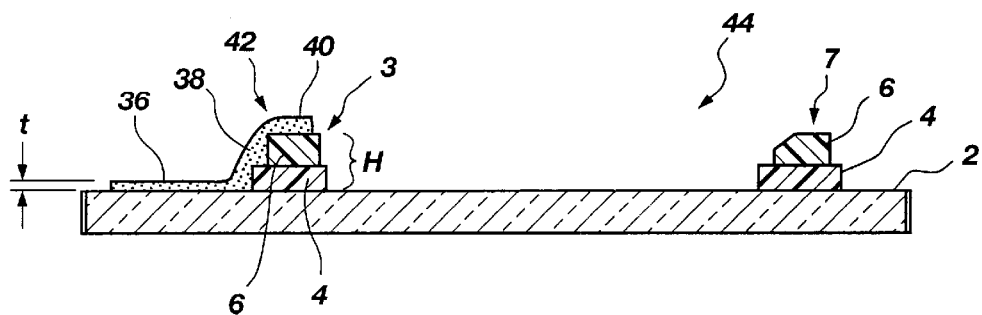
FIG. 3B is a cross-sectional view taken along line 3B—3B of a selected portion of the representative microelectronic component illustrated in FIG. 3A.
Figure 3A:
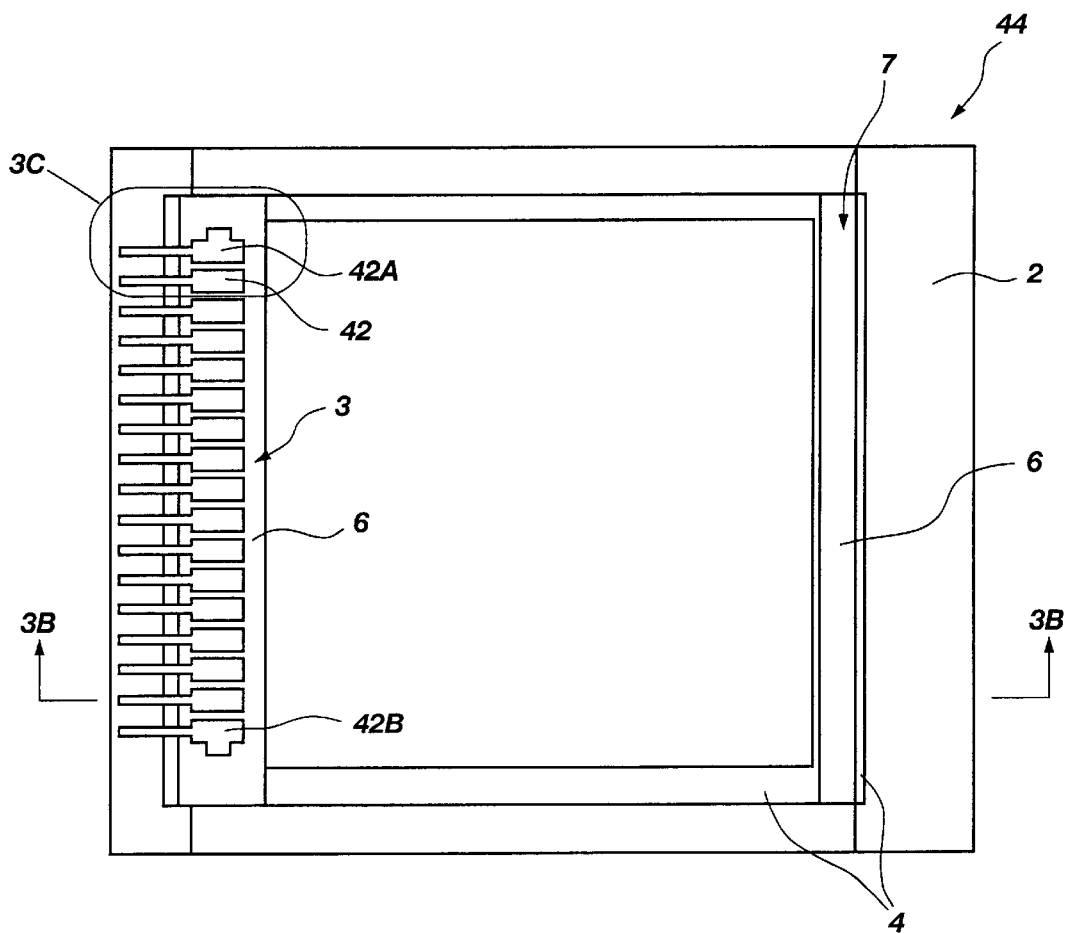
FIG. 3A is plan view illustrating a representative microelectronic component in which exemplary conductive traces have been disposed on a portion thereof in accordance with the present invention.

Illustrated in drawing FIG. 3A is a top view of an exemplary, simplified anode plate 44 of a FED device having an insulative spacer 3 having a plurality of conductive traces 42 formed on a substrate 2 and upon insulative layer 6 of ridge 3 which is positioned along the left side of anode plate 44. Conductive traces 42 are formed in accordance with the preceding description and as shown in drawing FIGS. 2A through 2D. Outer located, end-most conductive traces 42A and 42B shown in drawing FIG. 3A differ from intervening traces 42 in that only end traces 42A and 42B have outwardly facing alignment tabs. Insulative layer 4 can be screen printed onto substrate 2 to provide a raised insulative border about the periphery of anode plate 44. Opposite of ridge or spacer 3 is another ridge or spacer 7, also comprised of screen printed insulative layers 4 and 6.

Illustrated in drawing FIG. 3B is a representative cross-sectional view of anode plate 44 as taken along line 3B—3B of drawing FIG. 3A. In the cross-sectional view of drawing FIG. 3B, conductive trace 42, having a nominal vertical thickness of t, extends from the left edge of substrate 2, extends over the top-most surface of layer 6, which, as previously described, in combination with layer 4, comprises insulative spacer 3 having a preselected height H. Oppositely positioned spacer 7, comprised of layers 4 and 6, is located on the right side of substrate 2 as shown in drawing FIGS. 3A and 3B and will usually be provided with the same preselected height H so that a complementary cathode plate 50 will be positioned so as to span across the insulative spacers 3 and 7 as shown in a simplified manner in the perspective view of drawing FIG. 8, making electrical contact with the various contact portions of conductive traces 42, including end traces 42A and 42B, having respectively shaped geometries for alignment purposes, located atop layer 6 of spacer 3. In operation, transparent area 45 will ultimately serve as the viewing window for the FED device. Optional contact pads can be provided on top of spacer 7 (not shown) if desired. Furthermore, oppositely positioned conductive traces could be disposed on spacer 7 in accordance with the present invention.

Returning to FIGS. 3A through 3E, as illustrated, the exemplary conductive traces formed by the uphill screen printing process of the present invention can have geometries of various shapes and sizes, and be located from each other within a wide range of spacing distances, as well as with respect to other nearby structures.

Figure 3C:
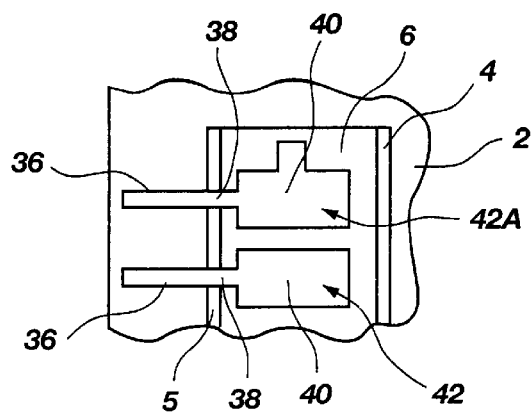
FIG. 3C is an enlarged plan view depicting a representative, isolated portion of the microelectronic component including two laterally adjacent conductive traces as illustrated in FIG. 3B.
Figure 3D:
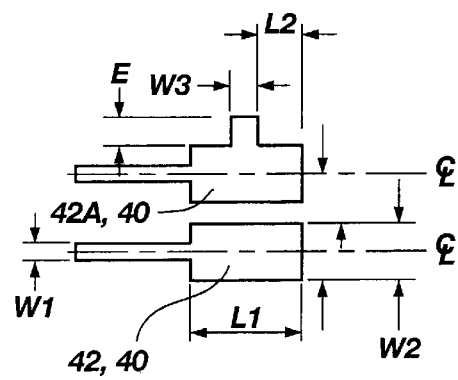
FIG. 3D is a plan view showing the two conductive traces of FIG. 3C in isolation.

Drawing FIGS. 3C and 3D, in particular, show in enlarged detail the exemplary conductive traces 42, including 42A and 42B, to be provided on exemplary anode plate 44 of a representative FED device as discussed and illustrated herein. Such provides a non-limiting example of the precise dimensioning and spacing of screen printed structures that can be disposed onto multiple levels of a work piece, such as a generally planar substrate 2 made of suitable glass or ceramic material, up onto an elevated structure, such as spacer 3 formed of insulative layers 4 and 6. Exemplary dimensions and spacing or, as referred to in the art, the pitch between conductive traces or pads, are depicted in drawing FIG. 3D. In drawing FIG. 3D, upper portions of conductive trace 42 have a generally rectangular profile extending along an imaginary centerline CL and further have a narrower width W1 and a relatively wider width W2. Furthermore, upper-level portion 40 of conductive trace 42 has a length L1. The proximately positioned conductive trace having a modified upper portion 42A is provided with an outwardly extending tab portion having a width W3, a tab extension length E, and an offset length L2. By way of example, the various dimensions can be sized as follows. Length L1 can be approximately 24.1 mils (0.0241 inches/0.0612 cm), a width W1 of approximately 8.0 mils (0.008 inches/0.020 cm), a width W2 of approximately 12.0 mils (0.012 inches/0.0304 cm), a width W3 of approximately 8.0 mils (0.008 inches/0.020 cm), an extension length E of approximately 6.0 mils (0.006 inches/0.015 cm), a length L2 of approximately 4.0 mils (0.004 inches/0.010 cm), and a centerline-to-centerline spacing or pitch of 20 mils (0.020 inches/0.050 cm). Region 5 denotes the uphill, or elevational transition, area of the conductive traces.

By way of example, the two particular traces shown in FIG. 3D were screen printed in accordance with the present invention to a "wet" depth of approximately 0.5 mils (0.0005 inches/0.0013 cm) in vertical thickness or height, approximately 6 mils (0.006 inches/0.015 cm) in nominal width, and having a pitch in spacing of approximately 20 mil (0.020 inch/0.05 cm). The particular electrically conductive paste used is a gold based, screen printable paste available from a number of commercial suppliers such as IMR Corporation, having a preferred viscosity of approximately 250,000 to 400,000 centipoise. Upon firing the substrate in an oven, the nominal thickness of the exemplary conductive traces was reduced to approximately 0.2 mils (0.0002 inches/0.0005 cm).

The preceding example is provided herein to illustrate that the subject method of screen printing is readily capable of producing small, well-defined structures, such as conductive traces 42, 42A, and 42B, extending between at least two levels, and other such screen printed structures particularly useful in the production of microelectronic devices such as FED devices.

Furthermore, the acceptable range of viscosity for a given screen printable substance or paste will be significantly influenced by overall thickness or height, length, width, and spacing or pitch, with respect to other traces that are to be simultaneously formed of the screen printable material and are positioned to be in close proximity to each other.

Figure 3E:
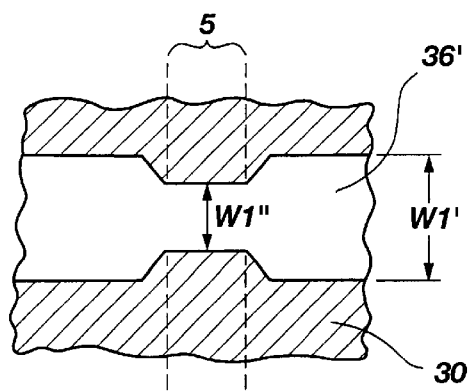
FIG. 3E is a plan view of an isolated portion of a necked-down opening or pattern formed through a screen and in which the necked-down portion thereof corresponds to the "uphill" region in which a generally rectangular conductive trace, for example, is to make a transition to a higher level, thus allowing the final conductive trace to have a generally constant width along its longitudinal axis in accordance with the present invention.

Referring now to drawing FIG. 3E, wherein a representative opening or pattern 36' has been formed in screen 30 to have a preferred configuration in order to minimize the amount of any unwanted distortion in printing the "uphill" portion 5 of a screen printable structure, such as conductive trace 42, on a substrate 2 as illustrated in other FIGS. of the drawings. In particular, opening 36' has a nominal width W1' which corresponds to the nominal width W1 that lower portion 36 of a given conductive trace 42 is to have. In the preceding example, W1 of conductive trace 42 is approximately 8 mils (0.008 inches/0.203 mm) across. Thus, for lower-level portion 36 of conductive trace 42 that is to be screen printed onto the preferably generally planar substrate 2, the corresponding region in screen 30 would also have a nominal width W1' of approximately 10 mils (0.010 inches/0.025 cm) across. When printing the "uphill" portion of lower-level portion 36 of a structure, such as conductive trace 42, there may be a tendency of the screen printable material to disperse laterally or bulge, and thereby possibly contact or touch other structures positioned nearby, such as a neighboring conductive trace 42. Of course the predisposition toward such unwanted dispersal or bleeding will be influenced by ambient conditions such as temperature and pressure, the vertical distance or height H in which the conductive trace is to extend up to, and the viscosity of the particular screen printable material being printed, the nominal thickness of the screen, the snap-off distance d, the softness of the squeegee, and whether or not the screen may be sufficiently biased against the workpiece to be screen printed so as to create a suitable seal or "gasket" about the area in which the screen printable material is to be applied. Thus, to prevent, or at least minimize, such unwanted lateral dispersal or bulging when working with relatively low viscosity screen printable material, such as low viscosity gold based conductive paste, and when forming particularly small, closely spaced structures that are to extend vertically for significant vertical distance or height, it is preferred that the corresponding width W1'' be narrowed or reduced at the particular region in which the screen printed structure is to extend upwardly. In other words, in some cases it may be desired to neck down the width of the opening 36' where the uphill portion 38 of a conductive trace 42, for example, is to rise to the next level in which upper-level portion 40 will be disposed. As an example, W1'' of screen opening 36' was formed to have a gradually reduced configuration (as shown) to a nominal dimension of approximately 6 mils (0.006 inches/0.015 cm) in order to prevent any unwanted lateral dispersal from either side of "uphill" portion 38, with uphill portion 38 rising to a height H between approximately 8 mils (0.008 inches/0.020 cm) to 10 mils (0.010 inches/0.025 cm). The resulting conductive trace 42 was screen printed with a conductive paste having a viscosity between 250,000 to 400,000 centipoise. Of course, the various influencing factors previously listed can be greater or less than the exemplary ranges provided, but it will now be apparent to those skilled in the art that when adjusting one factor, one or more of the other factors can and may need to be adjusted to optimally compensate for the particular structure to be formed without going beyond the scope of the present invention.

Figure 4:
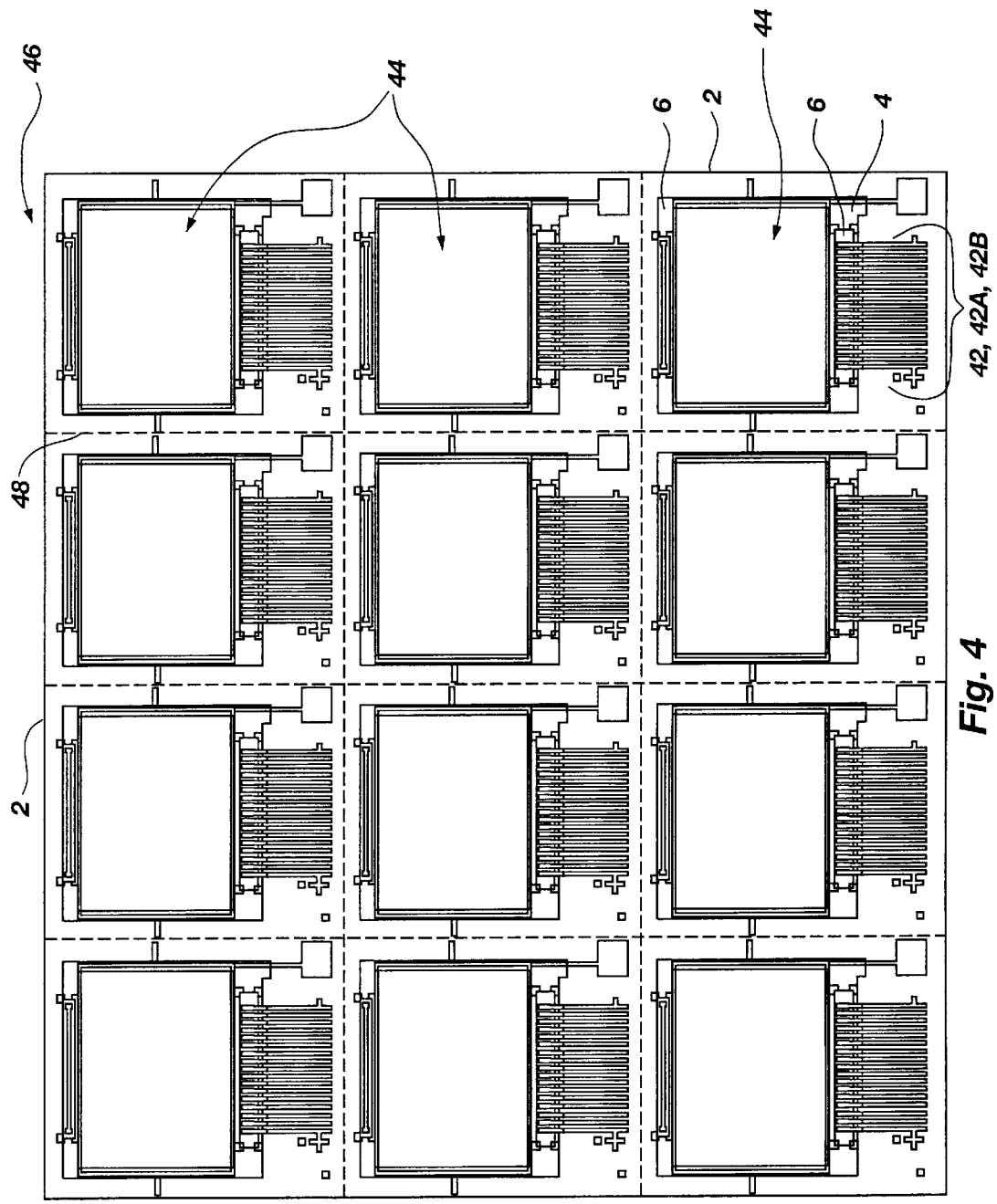
FIG. 4 is a plan view of a 3×4 array of certain layers of exemplary microelectronic components formed on a common, yet to be subdivided, substrate, wherein each component includes conductive traces disposed thereon in accordance with the present invention.

Drawing FIG. 4 depicts a plan view of a yet to be segmented glass substrate 2 comprising a plurality of what will eventually be individual anode plates 44, each having insulative spacers comprised of layers 4 and 6, as well as screen printed conductive traces 42, 42A, and 42B extending from substrate 2 upward onto layer 6 as previously illustrated and described herein. The particular array 46 shown in drawing FIG. 4 is referred to as a 3×4 array due to substrate 2 having three rows and 4 columns of what will eventually be twelve individual anode plates 44. Upon all screen printing operations being performed on substrate 2, including the "uphill" screen printing of conductive traces 42, optional end-most traces 42A, 42B, in accordance with the present invention, and any firing that may be required, substrate 2 is segmented by scoring or cleaving 48, or any other suitable method for separating substrate 2 into twelve individual anode plates 44. Segmented anode plates 44 will then, in due course, be assembled with respective complementary cathode plates, such as cathode plate 50 illustrated in drawing FIG. 8, thereby providing twelve individual exemplary FED devices. As will now be apparent, smaller or larger arrays of FED devices or other microelectronic devices can be screen printed in accordance with the present invention, limited only by the size of the screen that can be accommodated by the particular screen printing equipment being used and the size of the microelectronic component or components being produced on a given common substrate of suitable material. Thus, it can be appreciated that embodiments of the disclosed screen printing method are particularly suitable for implementation within a variety of production lines used for screen printing of microelectronic devices, including, but not limited to, FED devices.

Figure 5:
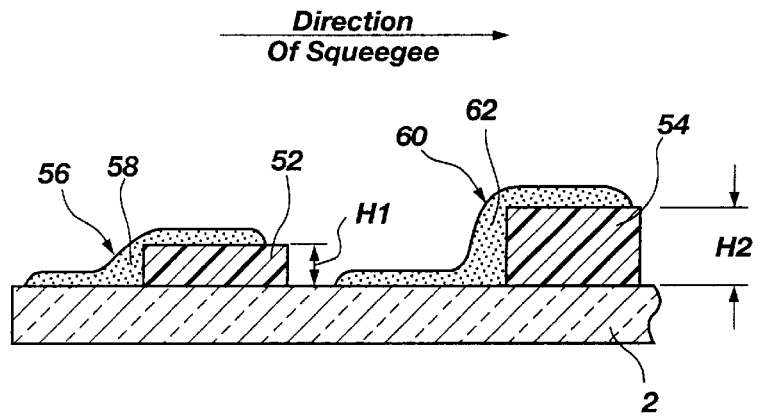
FIG. 5 is a cross-sectional view of a portion of a representative microelectronic component in which two different conductive traces have been disposed on a substrate and respective spacer elements of differing heights in accordance with the present invention.
Figure 6:
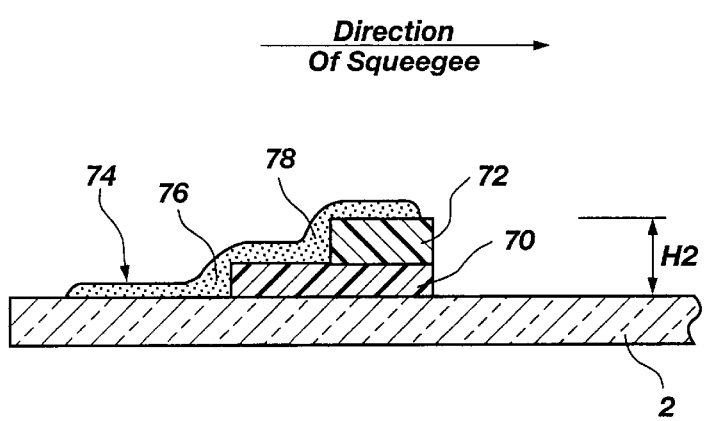
FIG. 6 is a cross-sectional view of a portion of a representative microelectronic component in which one conductive trace is disposed upon a spacer element having a plurality of levels in accordance with the present invention.
Figure 7:
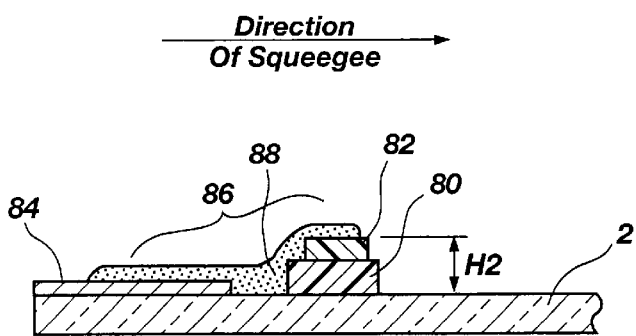
FIG. 7 is a cross-sectional view of a portion of a representative microelectronic component in which a pre-existing lower level conductive trace is electrically connected to an elevated bond pad in accordance with the present invention.

Drawing FIGS. 5, 6 and 7 further illustrate the suitability and adaptability of the present invention for the screen printing of screen printable structures, such as multi-level conductive traces, onto a substrate having insulative structures, such as spacers or ridges, of differing heights and configurations.

Substrate 2 of drawing FIG. 5 has a first rectangularly shaped insulative ridge or spacer 52 having a vertical height H1. Proximate to first ridge or spacer 52 is a second, taller rectangularly shaped ridge or spacer 54. As can be seen on the left side of drawing FIG. 5, a first screen printed structure, such as a conductive trace 56 having an uphill portion 58, has been screen printed onto substrate 2 and up onto the top-most planar structure, such as an insulative spacer 52. A second screen printed structure 60, also exemplified as being a conductive trace, extends from substrate 2 upward and to the right having an uphill portion 62 onto the top-most surface of second spacer 54 having a vertical height H2, which, in this particular illustration, happens to be greater than vertical height H1 of first spacer structure 52. The preferred direction in which the squeegee travels across the screen (not shown in drawing FIG. 5) is denoted. Conversely, the first and second spacers 52 and 54 could be transposed in position. That is, taller spacer 54 could be located on the left side of substrate 2 and likewise, shorter spacer 52 could be located on the right side of substrate 2 if desired.

In drawing FIG. 6 a representative substrate 2 is shown having a first spacer 70 of a generally rectangular cross-section, and a second smaller additional spacer 72, also of a generally rectangular cross-section. Second spacer 72 is off settingly positioned on top of first spacer 70 to create a ledge or shelf, which results in spacers 70 and 72 having a combined height H2 as measured from the top-most surface of substrate 2. A screen printed structure, such as a conductive trace 74 screen printed in accordance with the present invention, extends from the left side of drawing FIG. 6 generally upwardly and toward the right, up and thus onto the top-most exposed surface of structure 70, exemplarily depicted as an insulative spacer. Conductive trace 74 further extends generally upwardly and toward the right so as to be disposed onto the top-most surface of structure 72, also exemplarily depicted as being an insulative spacer. As with drawing FIGS. 5 and 7, the preferred direction of squeegee travel is shown proceeding from left to right with the vertical distance H2 having a maximum dimension of at least approximately 10 mils (0.010 inches/0.025 cm). Thus, conductive trace 74 of drawing FIG. 6 has two uphill portions 76 and 78, thereby providing an example of a continuous, multi-level, screen printed conductive trace or structure 74 disposed upon a substrate 2 and extending to the top-most surface of multi-level or stepped spacer 72 in accordance with the present invention.

The illustration of drawing FIG. 7 depicts an exemplary substrate 2 having a first structure, such as an insulative ridge or spacer 80 having a generally rectangular cross-section which, in turn, has a second smaller structure, such as contact or bond pad 82, positioned thereon resulting in a stacked vertical height of H2. Furthermore, substrate 2 has a generally planar rectangular structure such as conductive trace 84 disposed thereon such as by screen printing or other methods known within the art. Uphill screen printed trace 86 is disposed on at least a portion of the exposed upward facing surface of conductive trace 84 and is generally upwardly disposed from the right up onto the top-most exposed surface of contact or bond pad 82. Thus, continuous, uphill screen printed conductive trace 86 is provided with an uphill section 88 in accordance with the present invention, thereby providing a continuous screen printed trace 86 which electrically connects trace 84 located on the left side of drawing FIG. 7 with the upper-most surface of contact or bond pad 82. Therefore, conductive trace 86 being screen printed in accordance with the present invention provides a practical, cost-effective alternative to prior known wire bonding of two or more conductive traces or elements together to provide an electrical path therebetween.

It can further be appreciated that the screen printing process of the present invention can be utilized to provide a very large variety of screen printable structures which are to span across and/or upward onto at least one or more levels of a substrate having a wide variety of different shaped elevated structures thereon. It is also to be appreciated that the subject method of screen printing is suitable for forming structures which extend over and against at least one vertical side of a subject structure. For example, in addition to the exemplary structures disclosed herein having generally vertical sides that are generally perpendicular to the underlying substrate, structures having sides which are sloping, angled, curved, stepped, and other irregular shapes, are suitable candidates in which a screen printed structure can be disposed upon in accordance with the present invention.

Figure 8:
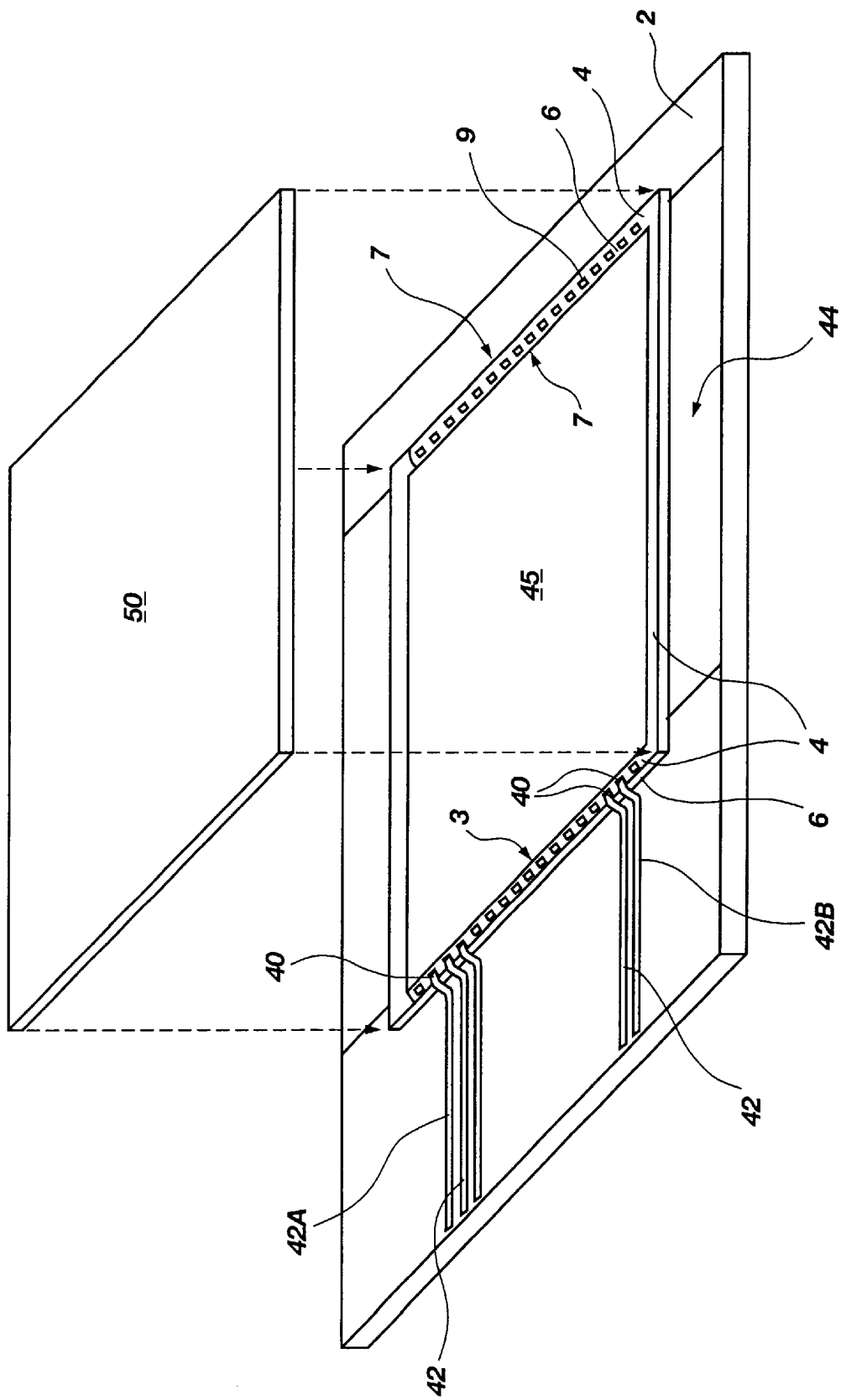
FIG. 8 is an exploded perspective view of a simplified representative microelectronic assembly, such as a field emission display device, constructed in accordance with the present invention.

Lastly, drawing FIG. 8 illustrates an exemplary anode plate 44 having conductive traces screen printed thereon in accordance with the present invention as discussed previously herein. Insulative spacer 3 as shown is generally rectangular, that is, spacer 3 is formed of insulative, dielectric layers 4 and 6 that have generally vertical side walls as illustrated in other drawing FIGS. As mentioned herein, in the context of manufacturing a FED device, a cathode plate 50 will typically be installed upon ridges or spacers 3 and 7 so as to be precisely spaced away from anode plate 44 by a preselected distance, yet will also be placed into electrical contact with the various conductive traces 42, including optional end-most traces 42A and 42B. Furthermore, oppositely positioned bond pads or electrical contacts 9 may be provided on the upper-most surface of insulative spacer 7, comprised of stacked insulative layers 4 and 6, if desired. Transparent area 45 of anode plate 44 will typically be the back side of the transparent viewing area upon the FED device being completely assembled.

Although the foregoing description contains many specifics, these should not be construed as limiting the scope of the present invention, but merely as providing illustrations of some of the preferred and exemplary embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method of manufacturing an electronic device comprising:
   providing a substrate having a first surface and at least one second surface located a preselected distance above the first surface;
   introducing the substrate to a screen printing apparatus comprising:
      a screen having a top surface and a bottom surface, the screen having a preselected mesh and thickness and having at least one preconfigured pattern formed therein; and
      a squeegee formed of a preselected material having a preselected hardness;
   introducing a screen printable substance on the top surface of the screen, the screen printable substance having a viscosity value within a preselected range;
   biasing the squeegee and the screen toward the substrate such that at least a portion of the bottom surface of the screen forms an angle with respect to the at least one second surface;
   forming a continuous screen printed structure extending from at least a portion of the first surface to at least a portion of the second surface by sweeping the squeegee across the top surface of the screen forcing at least a portion of the screen printable substance through the at least one preconfigured pattern and onto at least a portion of the first surface and at least a portion of the at least one second surface while maintaining the angle formed between the bottom surface of the screen and the at least one second surface within a preselected range; and
   maintaining a predetermined snap-off distance between the at least a portion of the bottom surface of the screen and the at least a portion of the first surface of the substrate.

2. The method of claim 1, wherein maintaining a predetermined snap-off distance between the at least a portion of the bottom surface of the screen and the at least a portion of the first surface of the substrate includes forming at least a portion of the continuous screen printed structure.

3. The method of claim 2, wherein the predetermined snap-off distance is generally maintained at a distance of less than approximately 0.2 mils (0.0002 inches/0.0005 cm).

4. The method of claim 2, wherein the predetermined snap-off distance is maintained within a range of approximately 0.1 mils (0.0001 inches/0.0003 cm) to approximately 0.125 mils (0.000125 inches/0.000317 cm).

5. The method of claim 1, wherein the substrate comprises at least one of a group comprising glass material and ceramic material.

6. The method of claim 5, wherein the substrate is comprised of borosilicate glass.

7. The method of claim 1, further comprising firing the substrate and the continuous screen printed structure.

8. The method of claim 1, wherein the at least one second surface is located on a spacer structure previously disposed on the substrate and the preselected distance above the first surface of the substrate does not exceed approximately 10 mils (0.010 inches/0.025 cm).

9. The method of claim 8, wherein the spacer structure is comprised of at least one of a group comprising an insulative material and a dielectric material.

10. The method of claim 9, wherein the spacer structure is comprised of a dielectric material.

11. The method of claim 8, wherein the spacer structure includes a plurality of stacked insulative layers.

12. The method of claim 1, wherein the screen printable substance comprises an electrically conductive paste and the preselected range of the viscosity value of the screen printable substance comprises approximately 50,000 to 600,000 centipoise.

13. The method of claim 1, wherein the screen printable substance comprises an electrically conductive paste and the preselected range of the viscosity value of the screen printable substance comprises approximately 250,000 to 400,000 centipoise.

14. The method of claim 13, wherein the squeegee has a durometer value ranging between approximately 50 and approximately 70 and the squeegee includes an edge having a generally triangular cross-section.

15. The method of claim 14, wherein the durometer value is approximately 60.

16. The method of claim 1, further comprising maintaining the angle formed between the bottom surface of the screen and the at least one second surface within a range of approximately 5° to approximately 10°.

17. The method of claim 1, wherein the preselected mesh of the screen ranges from approximately 80 to 500 and the thickness of the screen ranges between approximately 0.2 mils (0.0002 inches/0.0005 cm) and approximately 0.8 mils (0.0008 inches/0.0020 cm).

18. The method of claim 1, wherein the continuous screen printed structure has a nominal depth when wet not exceeding approximately 0.5 mils (0.0005 inches/0.0013 cm).

19. The method of claim 18, wherein the continuous screen printed structure has a nominal depth when fired not exceeding approximately 0.2 mils (0.0002 inches/0.0005 cm).

20. The method of claim 1, wherein the substrate comprises a plurality of second surfaces, each being positioned at a preselected height above the first surface of the substrate and wherein the continuous screen printed structure is formed to extend from the at least a portion of the first surface to the at least a portion of the at least one second surface.

21. The method of claim 1, wherein the continuous screen printed structure comprises at least one first portion being generally disposed at a first level, at least one uphill portion having an increased depth in comparison to a depth of the at least one first portion of the continuous screen printed structure, and at least one third portion being generally disposed on a second level vertically offset from the first level.

22. The method of claim 21, wherein the at least one third portion of the continuous screen printed structure has a depth approximately equal to the depth of the at least one first portion of the continuous screen printed structure.

23. The method of claim 1, wherein the at least one preconfigured pattern in the screen comprises a reduced geometry in a region of the at least one preconfigured pattern corresponding to an uphill region of a continuous structure to be screen printed.

24. The method of claim 23, further comprising sweeping the squeegee in a preselected direction and wherein the reduced geometry in a region of the at least one preconfigured pattern is generally perpendicular to the preselected direction.

* * * * *